United States Patent [19]

Kolesar, Jr.

[11] Patent Number: 4,989,063
[45] Date of Patent: Jan. 29, 1991

[54] HYBRID WAFER SCALE MICROCIRCUIT INTEGRATION

[75] Inventor: Edward S. Kolesar, Jr., Beavercreek, Ohio

[73] Assignee: The United States of America as represented by the Secretary of the Air Force, Washington, D.C.

[21] Appl. No.: 549,672

[22] Filed: Apr. 24, 1990

Related U.S. Application Data

[63] Continuation of Ser. No. 282,423, Dec. 9, 1988, abandoned.

[51] Int. Cl.$^5$ ............... H01L 27/02; H01L 27/22; H01L 29/34; H01L 29/06
[52] U.S. Cl. ............... 357/54; 357/40; 357/49; 357/55; 357/72; 357/75
[58] Field of Search ............... 357/49, 54, 55, 72, 357/75, 40

[56] References Cited

U.S. PATENT DOCUMENTS

| | | | |
|---|---|---|---|
| 3,864,810 | 2/1975 | Hargis | 29/423 |
| 3,868,724 | 2/1975 | Perrino | 357/357 |
| 4,042,955 | 8/1977 | Imai et al. | 357/72 |
| 4,074,342 | 2/1978 | Honn et al. | 361/411 |
| 4,199,777 | 4/1980 | Maruyama et al. | 357/49 |
| 4,330,790 | 5/1982 | Burns | 357/72 |
| 4,346,513 | 8/1982 | Nishizawa et al. | 357/55 |
| 4,494,303 | 1/1985 | Celler et al. | 357/49 |
| 4,604,642 | 8/1986 | Sakurai | 357/72 |
| 4,670,770 | 6/1987 | Tai | 357/60 |
| 4,685,030 | 8/1987 | Reyes et al. | 361/400 |
| 4,689,657 | 8/1987 | Percival et al. | 23/48 |
| 4,695,870 | 9/1987 | Patraw | 357/74 |
| 4,703,339 | 10/1987 | Matsuo | 357/81 |
| 4,756,929 | 7/1988 | Sullivan | 427/96 |
| 4,788,583 | 11/1988 | Kowahara et al. | 357/72 |
| 4,866,501 | 9/1989 | Shanefield | 357/81 |

FOREIGN PATENT DOCUMENTS

| | | | |
|---|---|---|---|
| 0217288 | 4/1987 | European Pat. Off. | 357/49 |
| WO85/03806 | 8/1985 | World Int. Prop. O. | 357/75 |

OTHER PUBLICATIONS

S. M. Sze, *Semiconductor Devices, Physic and Technology*, John Wiley & Sons, New York, (1985) pp. 370, 371 and 455.

K. Mukai et al., "Planar Multilevel Interconnection Technology Employing a Polyimide," *IEEE Journal of Solid-State Circuits*, vol. SC-13 (Aug. 1978) pp. 462 to 467.

"A Screen-Printable Polyimide Coating for Silicon Wafers", Kulesca et al., Motorola, Inc., Phoeniz, AZ.

"High Resolution, High Photospeed Polyimide for Thick Film Applications", Rohde et al., Ciba-Geigy Corporation, Santa Clara, CA.

"Polyimides in Hybrid Circuit Processing", John J. H. Reche, Reche Corp., Mountain View, CA.

"Pattering with Photosensitive Polyimide Precursors" Semiconductor International, Oct. 1987.

"Microelectronic Manufacturing and Testing", Apr. 1987.

"EPO-TEK 600, Screen Printable Wafer Coating", Epoxy Technology, Inc., Billerica, MA.

EM Industries, Inc., Advanced Chemicals Division, San Jose, CA.

"Selectilux P2100", E. Merck, Darmstadt, Germany.

"Die Bonding Equipment", Microelectronic Manufacturing and Testing, Jun. 1987.

*Primary Examiner*—J. Carroll
*Attorney, Agent, or Firm*—Gerald B. Hollins; Donald J. Singer

[57] ABSTRACT

A wafer scale integration arrangement wherein integrated circuit die of varying size, fabrication processes, and function are commonly mounted in the same host wafer using a filled epoxy material of special characteristics. The mounting epoxy material also serves as a substrate for the die interconnecting conductors in regions adjacent the mounted die. The described assembly also includes a newly available photosensitive polyimide material as a planarization and passivation covering for the die and host wafer and as a mounting surface for an interconnecting metal conductor array. Multiple levels of interconnection metal. Fabrication processes for the die to host wafer attachment and the passivation covering of the assembly are disclosed.

26 Claims, 7 Drawing Sheets

Single-Level Circuit with Interconnect Conductors
Die Interconnection

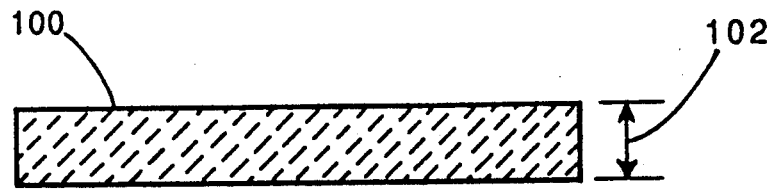
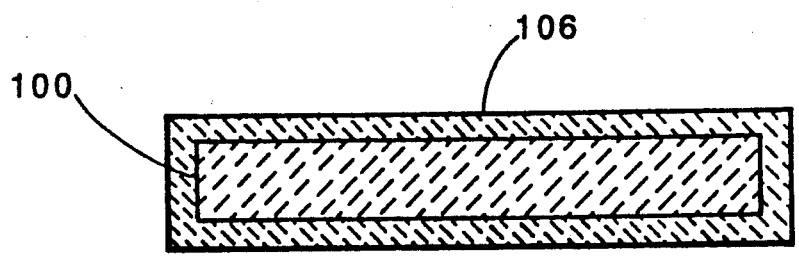
Fig. 1A
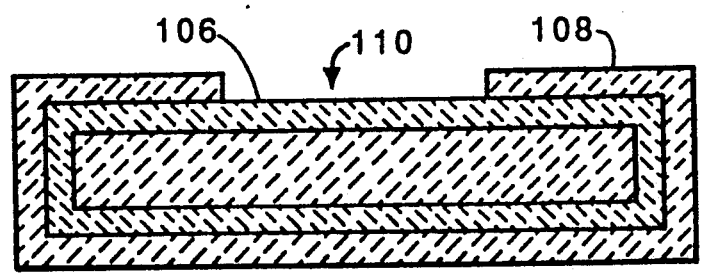
Fig. 1B
Fig. 1C
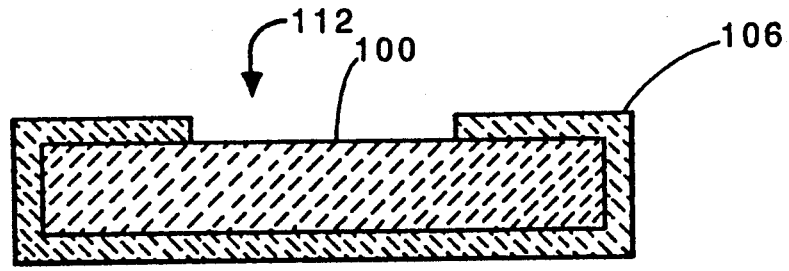
Fig. 1D
Wafer Preparation Anisotropic Well Cavity in a (100) Planar Oriented Substrate Anisotropic Etch Through Oxide Window Etched Wafer Photoresist and Window for Canal Isotropically-Etched Canal Receptacle To Lower Surface Canal Fabrication Wafer Scale Intergration Assembly Etched Wafer with Epoxy and Canal Die on Epoxy in Well Mounted Die Inverted Between Teflon Flats for Thermal Cycle Circuit Die Wafer Well Attachment Die with Polyimide Film Patterned Film with Vias Die with Sputtered Aluminum Film Mask for Interconnect Film Single-Level Circuit with Interconnect Conductors
Die Interconnection

HYBRID WAFER SCALE MICROCIRCUIT INTEGRATION

RIGHTS OF THE GOVERNMENT

The invention described herein may be manufactured and used by or for the Government of the U.S. for all governmental purposes without the payment of any royalty.

This application is a continuation of application Ser. No. 07/282,423, filed Dec. 9, 1988, now abandoned.

BACKGROUND OF THE INVENTION

This invention relates to the field of integrated electronic circuits of the variety wherein a plurality of different circuit types are received on a semiconductor carrier substrate and interconnected by metal conductors received on the carrier substrate.

Frequently in the design of a complex electronic system, such as a flight control computer or a radar for a modern day aircraft, there is a need to collect a variety of differing types of electronic circuitry into a single system. This need is often combined with the need for circuits that are as small and lightweight as possible and are also free of "pinout" and other conventional circuit interconnection limitations. Frequently, the circuits to be collected into one of these complex systems are of such diversity as being of both the analog and digital signal processing types, functioning with signal levels of differing amplitudes, functioning at significantly different operating speeds or operating frequencies, and in more recent systems, operating via the combination of optically and electrically coded signal types.

Often in such systems, it is therefore common to encounter individual integrated circuit die which are fabricated in accordance with a diversity of different processing technologies including, for example, die materials operating with oppositely charged carrier types, that is, P-type and N-type semiconductor materials, circuits of drastically different active device categorization, MOS and bipolar transistor types, for example, and circuits fabricated according to different design rules, circuits with three micron geometry features, for example, in combination with circuits possessing submicron geometry features.

Clearly, the prospect for combining circuits of this large variety on a single large scale integration wafer by using conventional circuit fabrication techniques is nearly if not totally impossible. Any one of the above cited circuit difference examples would in all reality frustrate even the best of the present day large scale integration circuit design teams in an attempt at single wafer integration.

The well known practice of mounting integrated circuit die in multiply pinned packages which are then soldered or otherwise attached to a printed circuit board has been used as a means to package combinations of diverse circuit die on a common substrate. Circuitry packaged in this manner is severely limited with respect to packaging density due to inductive and capacitive electrical coupling effects—a result of long interconnecting conductors; susceptibility to thermal and physical stressing events; weight penalties and "pinout" limitations.

Workers who have recognized these difficulties have attempted to combine a plurality of different circuit types on a single wafer by extending the concept of an integrated circuit package into the realm of plural diverse circuit die received on a single large wafer. By regarding the wafer as a packaging device and connecting individual die to the package using conventional techniques, these workers arrived at a form of wafer scale integration. A number of problems, including difficulties with the wire bonding used to electrically connect die and wafer, and difficulties in achieving permanent attachment between die and wafer have precluded the achievement of notable success in these efforts. Notwithstanding these difficulties with both the wafer integration and printed circuit approaches, the need for maximum flexibility in combining a variety of circuit types, increases in modern electronic systems, particularly in military and other state of the art systems.

The present invention provides an advancement in the state of this die and wafer combination art, that is, the wafer-scale integration art, to a level enabling its practical use in even military and other critical circuit applications. By way of incorporating a plurality of improvements in previously attempted die to wafer combinations, the present invention accomplishes these combinations at modest cost and with desirable reliability and manufacturing ease.

The combination of silicon circuit die with a silicon substrate member, notwithstanding, the previously encountered practical difficulties, is herein shown to offer desirable real life advantages including minimum size and weight penalties, significant heat conduction away from the die by the silicon or other material of a wafer, ability to control substrate electrical characteristics via substrate doping, substantially identical thermal coefficients of expansion between die and supporting substrate, and the ability to elect employed substrate properties through the selection of optimum Miller index crystal orientation in the substrate.

An arrangement wherein an integrated circuit chip is mounted on a ceramic carrier by embedding or encapsulating the chip in an epoxy resin is shown in the patent of B.M. Hargis, U.S. Pat. No. 3,864,810. The use of solderable connections and several layers of ceramic material, distinguish the present invention from the teachings of the Hargis patent.

Another integrated circuit mounting arrangement wherein the integrated circuit die are enclosed by an epoxy encapsulant is shown in the patent of F.A. Perrino, U.S. Pat. No. 3,868,724. In the Perrino mounting arrangement, sets of leads are formed on a flexible tape carrier with the leads penetrating through holes in the tape and terminating in contacts which are arranged in a pattern corresponding to the contact pattern of the integrated circuit die. A tape carrier distinguishes the present invention from the Perrino arrangement.

The patent of Honn et al, U.S. Pat. No. 4,074,342 discloses an integrated circuit chip carrier arrangement in which a carrier and a semiconductor material with similar thermal expansion coefficients are employed. The use of solder technology to interconnect various portions of the Honn et al apparatus distinguishes the present invention from the teachings of Honn et al.

The patent art also indicates that the mounting of integrated circuit die in a receptacle well portion of a semiconductor wafer has been attempted by several workers in the art. Included in these efforts is the work of K.L. Tai which is the subject of U.S. Pat. No. 4,670,770. In the Tai invention, the beveled sides of an isotropically etched receptacle well are mated with similarly beveled sides of the integrated circuit die being mounted using metallic conductor members received on both the receptacle well walls and the die surface. Preferably the Tai conductors are of solder wettable material. The use of conductor elements in a die to wafer retention capacity and the use of solder based materials in the Tai invention are distinguished from the arrangements described in the present invention.

A surface mounting arrangement for integrated circuit die is disclosed in U.S. Pat. No. 4,685,030 of J. Reyes. In the Reyes invention, surface mounting of the integrated circuit die is shown together with thick film interconnection and resistor patterns that are disposed on an insulating substrate. The Reyes invention contemplates the use of low pressure chemical vapor deposition for the conductors together with soldering of interconnecting terminals. The Reyes deposited metal is selected from the group of manganese, chromium, cobalt, nickel, molybdenum, tungsten, and alloys of these metals. The die surface mounting, metallic bonding of die to wafer, use of quartz or alumina wafers, and selected conductor materials are all points of contrast between the instant invention and the Reyes patent.

The patent of R. Percival, U.S. Pat. No. 4,689,657 discloses an integrated circuit interconnecting arrangement which uses an electrically conducting film containing standardized openings and a prearranged raster configuration. Selected portions of the Percival raster are subsequently removed by a laser, for example, in order to achieve a desired circuit configuration. The Percival invention also employs the laser for exposure of a photo sensitive film used in producing the isolated conductive areas of the conductive film in a photo etching process.

An integrated circuit die mounting arrangement of the inverted die and mesa interface type is shown in the patent of A. N. Patraw, U.S. Pat. No. 4,695,870. In the Patraw invention, a mesa interface member is joined to the face of the integrated circuit die and through an internal conductor carrier member. Although the Patraw die mounting arrangement considerably shortens the length of the bonding wires that join the integrated circuit chip with electrical conductors residing on the chip carrier, it is notable that such bonding wires are nevertheless a necessary portion of the circuit arrangement.

The patent of D.F. Sullivan, U.S. Pat. No. 4,756,929 concerns a printed circuit board arrangement for circuit mounting in which the conductors are provided with photopolymer formed U-shaped cross sections. The printed circuit board nature of the Sullivan invention and the conductor arrangement espoused by Sullivan readily distinguish the teachings of the Sullivan patent from the present invention.

As is suggested by these patents and the preceding discussion, the electronic art continues to need a more satisfactory wafer scale integration arrangement, an arrangement which especially achieves the ability to receive integrated circuit die of differing process technology as well as different electrical function in a common and small sized physical package that also provides a flexible interconnection arrangement.

SUMMARY OF THE INVENTION

In the present invention, a plurality of contributing concepts are combined into an improved wafer scale integration arrangement. According to the invention, a selected epoxy attachment is used to retain an integrated circuit die in a carefully sized receptacle well of a host semiconductor wafer. The epoxy material also serves in the functions of heat conduction, surface leveling, die insulating and as a support for the electrical conductors. In the assembled die and wafer structure, the function of insulating the electrical interconnection metal grids is provided by a new material which has desirable electrical and physical properties in addition to providing a photolithographic function that is useful in the device fabrication sequence.

It is an object of the invention therefore to provide a wafer scale integration arrangement in which the circuit die and their mounting substrate can be fabricated with substantially identical or physically identical materials.

It is another object of the invention to provide a wafer scale integration arrangement in which silicon integrated circuit die may be received in receptacle well cavities of a silicon host or substrate member.

It is another object of the invention to provide a wafer scale integration arrangement wherein the electronic circuit die, the substrate material carrying this die, and the medium joining the circuit die with the substrate material are all of compatible thermal expansion characteristics.

It is another object of the invention to provide a wafer scale integration arrangement in which circuit die of diverse manufacturing process technology and diverse electrical function can be combined into an integrated circuit wafer derived physical package.

It is another object of the invention to provide a wafer scale integration arrangement in which the die interconnecting conductors are provided with hazard-free and short-length access to the bonding pads of the integrated circuit die.

It is another object of the invention to provide a wafer scale integration arrangement in which the effects of expansion and contraction fatigue at discontinuity regions of the circuit topology are minimized.

It is another object of the invention to provide an integrated circuit arrangement in which a combined flat planar disposition of the interconnecting metal is accomplished and abruptly changing metal elevation topology is avoided.

It is another object of the invention to provide a wafer scale integration arrangement in which the interconnecting metal conductors can have constant cross-sectional area and smoothly changing route directions in order that metal migration, structural weakness, movement fatigue, and other frequently encountered metal conductor difficulties are avoidable.

It is another object of the invention to provide a wafer scale integration arrangement in which the die to substrate attaching material provides a plurality of functions.

It is another object of the invention to provide a wafer scale integration arrangement in which the die to substrate attaching material provides a planar die surface.

It is another object of the invention to provide a wafer scale integration arrangement in which the die to substrate attaching material provides for thermal conduction.

It is another object of the invention to provide a wafer scale integration arrangement in which the die to substrate attaching material provides stable die retention even in the presence of thermal cycling.

It is another object of the invention to provide a wafer scale integration arrangement in which convenient accommodation is provided for volatile products liberated during the die to substrate attachment sequence.

It is another object of the invention to provide a wafer scale integration arrangement in which convenient accommodation is provided for attachment media dispensing variations.

It is another object of the invention to provide a wafer scale integration arrangement in which convenient accommodation is provided for cure cycle expansion and contraction of the media which retains the circuit die integrated with the substrate material.

It is another object of the invention to provide a wafer scale integration arrangement in which an overlaying layer of unusually desirable electrical and physical properties is employed.

It is another object of the invention to proVide a wafer scale integration arrangement in which the overlaying insulating material is provided with photoresponsive characteristics that are useful and effort saving in the circuit fabrication processing.

It is another object of the invention to provide a wafer scale integration arrangement in which the die and wafer covering insulation material, the passivation material, is amenable to use in a plurality of stacked insulation and metal conductor layers.

It is another object of the invention to provide a wafer scale integration circuit arrangement in which the passivating insulation material provides an unusually useful degree of surface topology leveling.

Additional objects and features of the invention will be understood from the following description and the accompanying drawings.

These and other objects of the invention are achieved by a wafer scale integration multiple die integrated circuit structure which includes the combination of a semiconductor wafer host member having top and bottom planar surfaces; a plurality of receptacle wells received in selected top surface locations of the wafer; a plurality of integrated circuit die each including a plurality of electrical connection bonding pads, received one in each of the wafer member receptacle wells with the top die surfaces and the top wafer surface being in substantial planar alignment; adhesive means received in each of the receptacle wells intermediate the well surface and external surface portions of the integrated circuit die for physically connecting the die and wafer elements, the adhesive means also including planar surface conforming portions bridging between the planar surfaces of the die and wafer; a thin film dielectric material layer received over the top surface of the wafer and die and adhesive means planar surface conforming portions; a plurality of via apertures passing through the thin film dielectric material layer at locations coincident with the electrical connection bonding pads; an array of thin film metal conductors including both conductor portions extending through the apertures to the die electrical bonding pads and individual conductor portions residing on the thin film dielectric layer in a predetermined pattern of electrical interconnection.

BRIEF DESCRIPTION OF THE DRAWINGS

FIG. 1 shows a four-step wafer preparation sequence in accordance with the invention.

DETAILED DESCRIPTION

Figure 5:
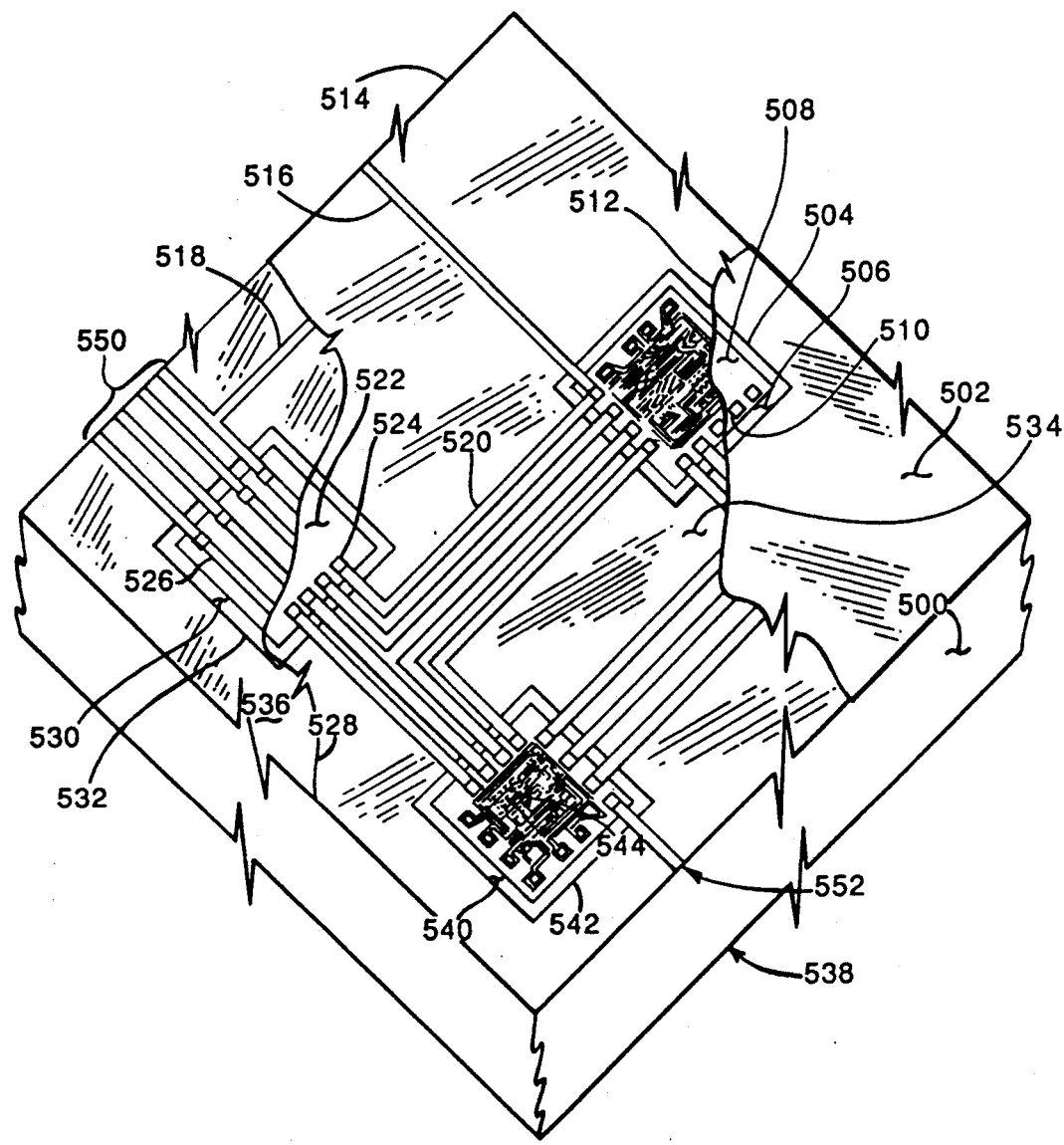
FIG. 5 shows a wafer scale integration assembly in overall perspective, partial wafer view.

FIG. 5 in the drawings shows a perspective and cutaway fragmented view of a wafer scale integration electronic circuit that is fabricated in accordance with the present invention. In FIG. 5, the substrate member 500 may be, for example, a portion of an intrinsic silicon wafer of the type generally used in the fabrication of integrated circuit electronic devices. In the FIG. 5 assembly, a collection of integrated circuit die members 508, 522 and 544 are received in receptacle wells 504, 532 and 542 disposed in the body of the wafer 500. Each of the circuit die 508, 522, and 544 in the FIG. 5 assembly includes a plurality of electrical interconnection pads such as the pads indicated at 510 and 524 for the die 508 and 522.

Joining the electrical termination pads in FIG. 5 is a predetermined array of electrical conductors which are similar in nature to the conductors used in conventional integrated circuit devices. Typical conductors in this array are identified at 516, 518 and 520 in the FIG. 5 assembly. These conductors may be fabricated of a metal such as aluminum and are disposed on a plurality of electrically insulating surfaces 534 and 536 that are described in greater detail herein below. The array of electrical conductors represented by the conductors 516, 518, 520 are disposed according to some predetermined plan of electrical interconnection for the die 508, 522 and 544 and the similar die which are located in distal and not shown portions of the FIG. 5 assembly. The break line 514 in FIG. 5 indicates the ongoing nature of the FIG. 5 assembly with the individual conductor elements terminating at the break line 514 and at other similar break lines as is indicated at 550 and 552 in FIG. 5.

Disposed intermediate to each of the die 508, 522 and 544 and the adjacent wafer surface at the wells 504, 532 and 542 are three annular regions 506, 530 and 540—regions that are vertically elevated to a substantially coplanar level with the wafer top surface 502.

As implied by the break lines 512 and 528, the FIG. 5 assembly includes a plurality of layers on which the interconnecting conductor array including the conductors 516, 518 and 520 are received. By way of the two conductor receiving layers indicated at 512 and 528 in FIG. 5, the conductor 518 and 520 reside in electrically insulated differing planes, each having its own elevation above the plane of the wafer surface 502. The conductors 518 and 520 are, of course, typical of additional conductors residing on the layers 512 and 528 and the layers 512 and 528 are also typical of additional layers that can reside in the FIG. 5 circuit. The conductors for the FIG. 5 assembly may be generally of the type used in a monolithic integrated circuit.

FIG. 1 in the drawings including the views of FIG. 1A, FIG. 1B, FIG. 1C, and FIG. 1D shows a sequence of steps by which a wafer of the type shown at 500 in FIG. 5 may be prepared for use in a wafer scale integration assembly according to the invention. In FIG. 1 is illustrated the process by which a host wafer of, for example, silicon is prepared to accommodate one die of a set of integrated circuit die comprising an assembly of the FIG. 5 type.

Silicon wafers as shown at 100 in FIG. 1 are supplied by manufacturers in a variety of thicknesses which typically range between 300 and 700 microns. For use in an assembly of the FIG. 5 type, the host silicon wafer substrate is preferably arranged to have a thickness 102 of at least 300 microns greater than the thickest integrated circuit die of the set to be mounted. This the 300 micron margin is desired for structural integrity and thermal heat sinking capability thickness margin also serves a desirable function in accommodating excess die mounting epoxy adhesive in the present invention.

The wafer 100 in FIG. 1A is preferably polished on both sides. In the steps shown in FIG. 1B the wafer is provided with a thermally grown thick silicon dioxide layer 106 which homogeneously covers the wafer surface area. As indicated below, a silicon dioxide thickness in the range of 2.5 to 3 microns is sufficient at 106; such thickness is principally determined from knowledge of the etching rate of the selected silicon etchant, a rate near 40 angstroms per minute for the materials described below herein. A silicon dioxide layer of this 2.5–3.0 micron thickness can also be grown in a period of 20 hours using a 1250° C. steam-based process.

The purpose of the silicon dioxide layer 106 is to create, with appropriate patterning and etching, windows which will expose selected surface area regions of the substrate. The etched windows are sized to dimensionally accommodate the integrated circuit die to be mounted in the wafer 100. Silicon dioxide is used as a masking material for the wafer 100 because it can be grown to precise thicknesses, and because it etches at an extremely slow rate when immersed in the anisotropic etchant used to fabricate the die receiving wells in the silicon substrate.

To create a silicon dioxide window for a specific integrated circuit die, a photolithographic mask having a window image that is on the order of two microns larger than the length and width dimensions of the integrated circuit die being mounted is used. To ensure dimensional accuracy in transferring an oxide window pattern from a photolithographic mask to the surface of the silicon dioxide layer, a positive photo resist such as the resist type M1350J of the Shipley Company of Newton, MA 02158 is preferred. This resist is applied to both the sides and the edges of the silicon substrate 100 using a conventional spin process with, for example, a 30 second spin at 4000 rpm. The resist is subsequently soft-baked at 95° C., for 25 minutes to physically harden its surface.

A pattern providing the photoresist opening 110 in the silicon dioxide layer 106 is printed into the photoresist layer 108 as shown in FIG. 1C using contact photolithography printing in order to minimize dimensional printing errors. An ultraviolet energy exposure in the range of 160 millijoules per square centimeter is used. The remaining photoresist, that is the layer 108, is hard baked to enhance its chemical resistance to the etchant solution. A bake at 120° C. for 30 minutes, for example, could be used.

The window 112, as shown at FIG. 1D, is disposed in the exposed silicon dioxide layer 106 using a buffered room temperature hydrofluoric acid solution. Buffering with ammonium fluoride in a volumetric ratio of 1:6 is used, that is, HF:NH$_4$F, 1:6. The ammonium fluoride buffering agent acts to modulate the isotropic silicon dioxide etch rate and minimize chemical etching of the protective photoresist. Oxide etch completion can be discerned by testing the exposed surface for hydrophobic tendency; the silicon wafer material being hydrophobic, the silicon dioxide material being wetted by a test drop of water. The buffered hydrofluoric acid solution does not etch the crystalline silicon of the wafer 100 to a measurable degree.

The generation of a receptacle well for the circuit die to be received in the wafer 100, that is, the generation of a receptacle well in alignment with the etched oxide window 112 of FIG. 1D, is accomplished by an anisotropic chemical etch through the oxide window 112. An anisotropic chemical etch makes use of the differing etch properties along the three orthogonal crystallographic orientations of single crystal silicon. Three principal crystallographic orientations are illustrated by the aperture 202 in the wafer segment 200 of FIG. 2. Such crystallographic orientations are conventionally described in terms of their planar Miller indices.

The concept of Miller indices, the symbols used to denote different Miller planes, and the use of Parenthesis ( ), braces { }, brackets [ ], and less than and greater than symbols, < >, to indicate planes, planes of symmetry, crystal directions and sets of equivalent directions in a crystal structure respectively are believed to be well known in the art and are used herein as needed. A concise explanation of these conventions is to be found in numerous texts known in the art including "Semiconductor Devices Physics and Technology" by S.M. Sze, Published by John Wiley and Sons and copyright in 1985 by Bell Telephone Laboratories. The Sze text is hereby incorporated by reference herein. The material of sections 1.2 and 1.3 at pages 5-7 of the Sze text is especially helpful in explaining these symbols and conventions. The Sze text, in addition, includes at page 315 an explanation of the convention used in coding semiconductor wafers according to their Miller orientation and conductor type—coding which uses a series of "flats" disposed around the wafer circumference.

Figure 2:
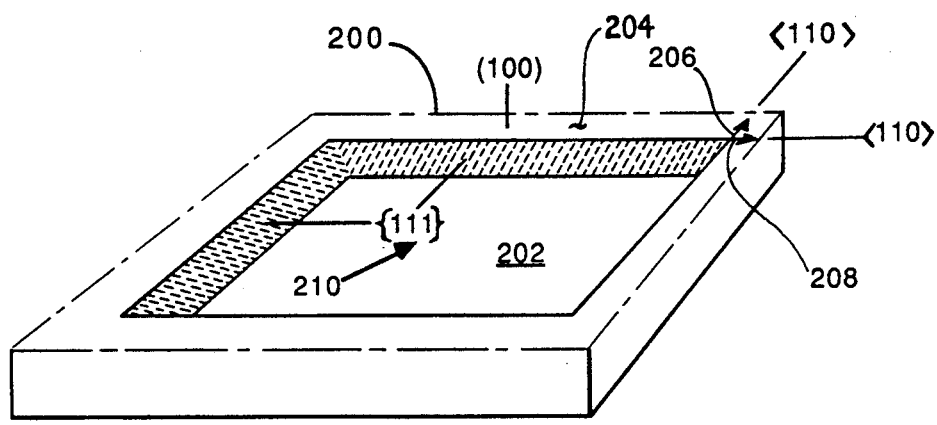
FIG. 2 shows an anisotropic well etched in a wafer substrate.
Figure 3:
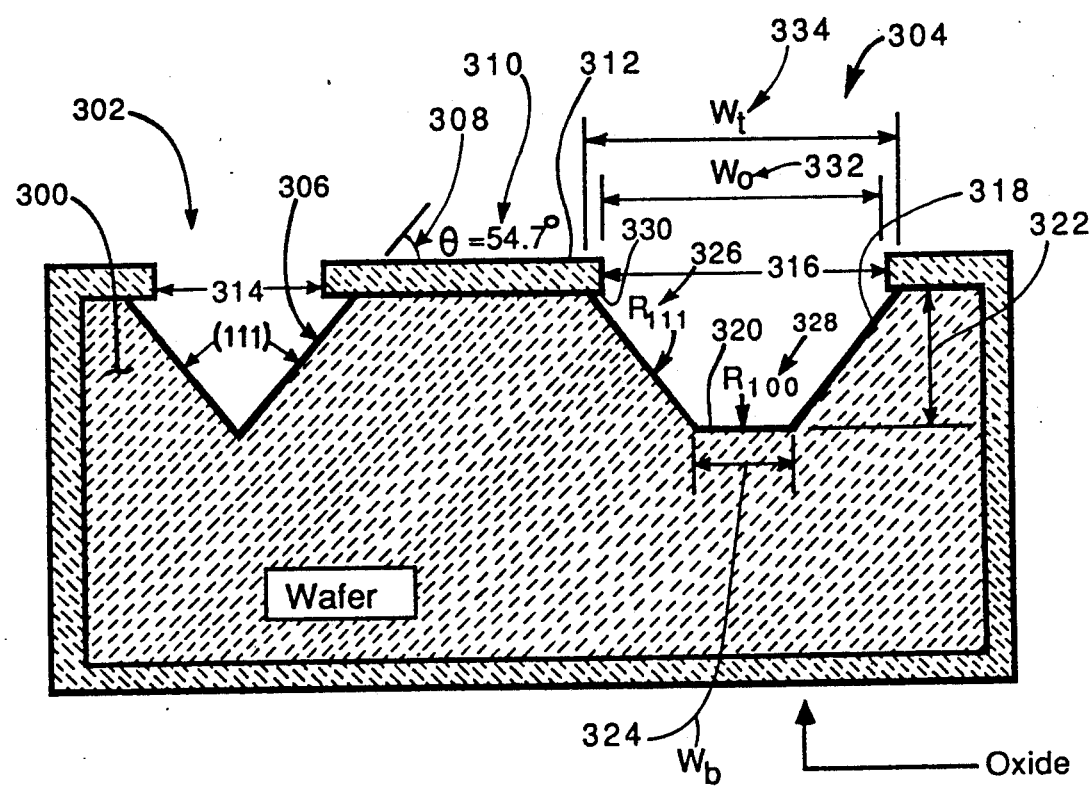
FIG. 3 shows two stages of an oxide window determined anisotropic wafer etch.

The rate of anisotropic etching of a wafer of the type shown at 100 and 200 in the drawings is found to decrease in the order of orientations (100), (110) and (111) for the three principal planar Miller indices. In the FIG. 2 representation, the (100) oriented wafer surface is indicated at 204 and the (111) surfaces exposed by a wafer etch are indicated at 210. In addition, the arrows 206 and 208 indicate the <110> oriented directions in the wafer 200. For use in the present invention, it is found that a wafer having the (100) Planar Miller index orientation is to be preferred because of the wafer anisotropically etching at a 54.7 degree angle with respect to the wafer's surface. As shown in FIGS. 2 and 3, a rectangular-shaped well opening at the surface can be achieved with a (100) oriented wafer, and since the rectangular perimeter dimensions are much greater than the receptacle depth, the vee-shaped rectangular 'well' depicted in FIG. 3 is formed (the (100)—plane forms a flat well bottom).

Wafers of this orientation are produced and sold by wafer manufacturers including Virginia Semiconductor Inc., of Fredericksburg, VA 22401.

By utilizing an etchant material that preferably etches in the <100> direction, that is in the direction orthogonal to the (100)-plane, etching in the <111> direction is very slow and can be for all practical purposes neglected. In addition, by judiciously aligning the photolithographic mask with the <110> direction with respect to the wafer primary reference flat, the <110> directed etch process will be retarded by the (111) planes shown in FIG. 2.

FIG. 3 in the drawings shows an enlarged view of a (100) planar oriented silicon wafer 300 together with a pair of oxide defined receptacle well cavities 302 and 304 of the type which may be used in the present invention for integrated circuit die mounting. The FIG. 3 drawing indicates several characteristics that are expected with the anisotropic etching preferred for use in the present invention. Among these characteristics are the 54.7° angle indicated at 308 and 310 in FIG. 3, that is the angle formed between the etched well sidewalls 306 and 318 and the wafer surface 312 during anisotropic etching of (100) Planar oriented silicon. As a result of the preferential or faster etching rate in the horizontal directions of the FIG. 3 wafer 300, etching through a relatively small oxide window such as the window 314 can be expected to produce a vee-shaped or pointed bottom cavity as is indicated for the cavity 302. For a wider oxide window such as the window 316, etching of the lateral or (111) planes of the wafer can be expected to provide a flat bottomed or inverted trapezoid cross-sectional well shape as is shown for the cavity 304 in FIG. 3. The flat bottom portion 320 of the cavity 304, of course, results from the above described appreciably slower etching rate prevailing for the <111> directional etch. The etching rate for the different directions of the cavity 304 are indicated at 326 and 328 in FIG. 3.

The following equations, which are essentially specialized expressions of the relationship that distance is equal to rate multiplied by time may be used to calculate the etch dimensions achieved with an oxide photolithography mask:

$$W_o = W_t + [(-2 \sin \theta) \cdot (R_{111}) \cdot (t)] \quad (1)$$

$$W_t = W_b + \{2/[(\tan \theta) \cdot (R_{100}) \cdot (t)]\} \quad (2)$$

$$W_o = W_b + \{2/[(\tan \theta) \cdot (R_{100}) \cdot (t) - (2 \sin \theta) \cdot (R_{111}) \cdot (t)]\} \quad (3)$$

where $W_o$ is the width of the oxide opening along one window edge, 332 in FIG. 3, $W_t$ is the width of the well opening beneath the oxide mask, 334 in FIG. 3, $W_b$ is the width 324 of the well along one edge, $\theta$ (=54.7 degrees) is the angle formed between the plane of the wafer's surface and the side-walls, $R_{111}$ is the rate of silicon etch in the <111> direction, $R_{100}$ is the rate of silicon etch in the <100> direction, t is the length of time that the silicon wafer is immersed in the etchant, and d is the depth 322 of the well [that is, $d = (R_{100}) \cdot (t)$]. Equations (1)–(3) enable the correlation of etch times and distances in a fabrication sequence.

As is indicated at 330 in FIG. 3, it is possible for the etching of the cavities 302 and 304 to undercut the oxide layer 312 unless the etching is controlled to preclude such undercutting. For use in the present invention wherein a cavity of the type indicated at 304 is to be filled with an adhesive and then receive the integrated circuit die, the undercutting indicated at 330 is not a problem and is, in fact, somewhat desirable as an aid in retaining the epoxy and integrated circuit die captive within the cavity 304. The above indicated two micron dimensional difference enables this captive retention.

The cavity dimensions indicated at 324 in FIG. 3, a "perimeter" dimension, is, of course, selected to accommodate the integrated circuit die being mounted. Preferably the cavity perimeter 324 is made to exceed the die to be mounted by 2 microns in the present invention in order to provide structurally sound regions of epoxy 506, 530 and 540 between die and receptacle well surfaces.

For etching receptacle wells of the type shown at 302 and 304 in FIG. 3 a buffered potassium hydroxide anisotropic etchant is preferred. The optimum etchant composition consists of potassium hydroxide (KOH), isopropyl alcohol ($CH_3CHOHCH_3$), and deionized water, in the weight ratio of 25:15:60. When this etchant composition is controlled at 80° C. the etch rate is 0.6 microns per minute for the (100) plane, 0.1 microns per minute for the (110) plane, and 0.006 microns per minute for the (111) plane. The etchant rates therefore have a ratio of 100:16:1. Since this etchant material also etches silicon dioxide, at a relatively slow rate near 40 angstroms per minute, the required thickness of the silicon dioxide protective mask described in FIG. 1 is effectively determined. Generally a silicon dioxide layer 2.5 to 3 microns thick is sufficient at 106 in FIG. 1.

In order to achieve the desired flat uniplanar condition described in FIG. 5, during mounting of the integrated circuit die 508, 522 and 544 and also to accommodate the presence of air bubbles or small void spaces in the epoxy material joining the integrated circuit die and receptacle well 304 in FIG. 3 it is desirable for the employed quantity of epoxy material to be as noncritical as possible. Clearly, the tolerances to reasonably be expected in a manufacturing sequence are capable of varying the volume of epoxy material needed for filling the space between the integrated circuit die and the receptacle well. These variations can result in either undesirably large void spaces or excessive adhesive material presence in the die to well space—in the absence of some accommodating provision in the FIG. 5 assembly. In order to accommodate these volumetric changes and to also accommodate expansion or contraction of the epoxy material during its cure sequence, it is desirable to include a reservoir or canal opening into the receptacle well structure 304 in FIG. 3.

Figure 4A:
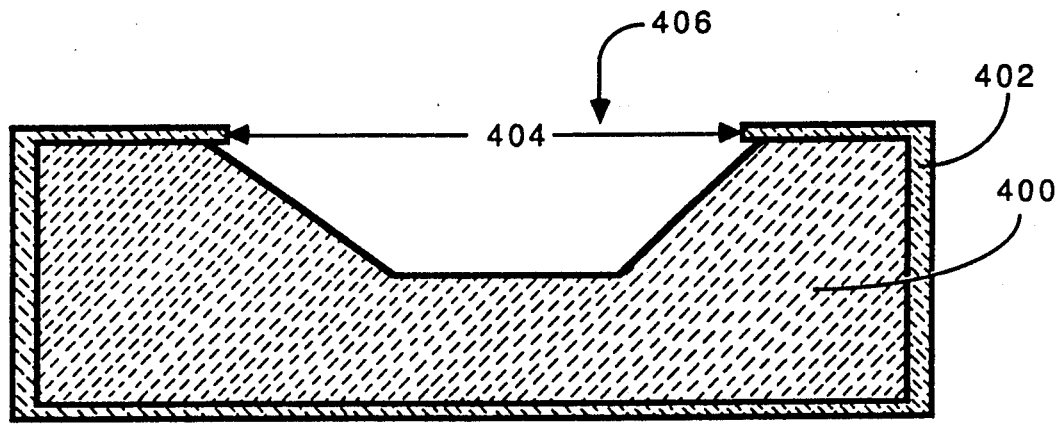
FIG. 4 shows a three-step, sequence for the etching of a receptacle well into the lower wafer surface connecting canal.
Figure 4B:
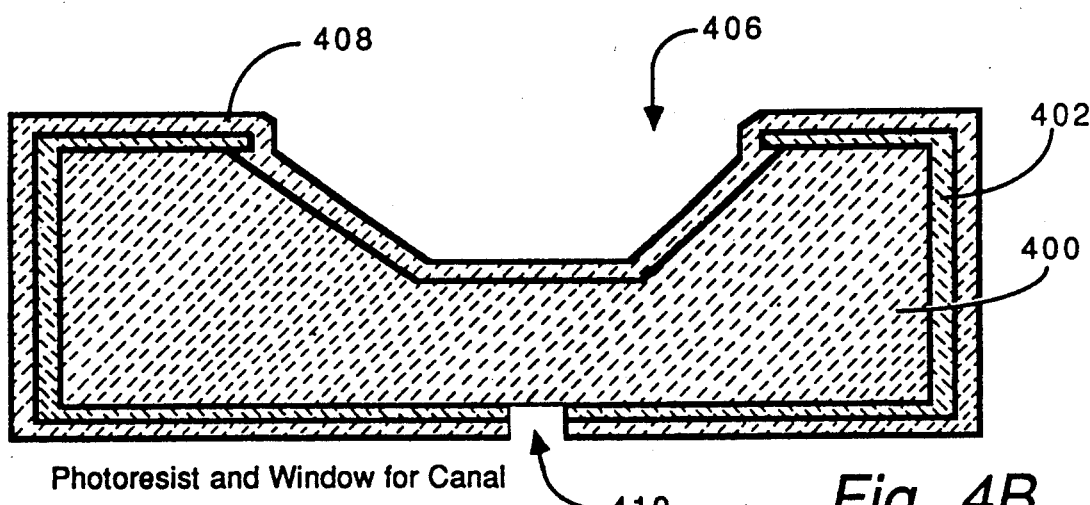
Figure 4C:
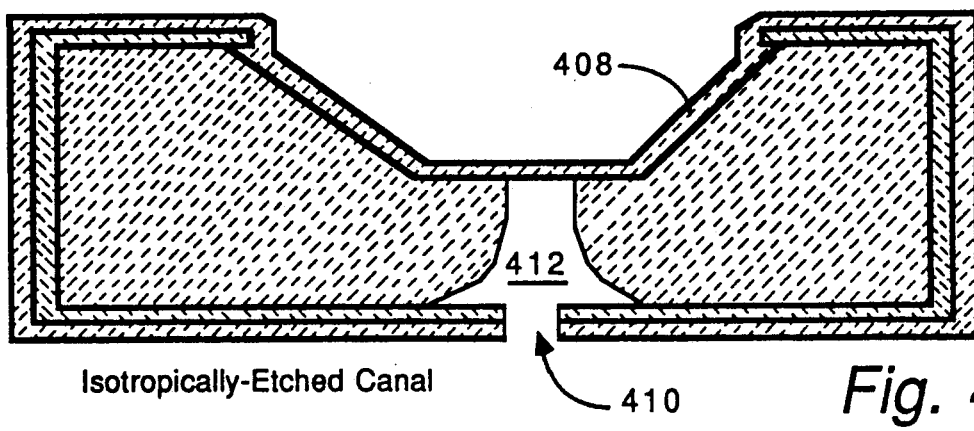

A sequence of steps for accomplishing such a port or canal is shown in the views of FIGS. 4A, 4B, and 4C in FIG. 4 in the drawings. In the step of FIG. 4A, a wafer 400 having the oxide window 406 and an integral oxide layer 402 covering non-windowed portions of the wafer are shown. In FIG. 4B, the oxide layer 402 has been etched away in the region 410 using a positive photoresist coating 408 that was spun onto the surface of the silicon wafer 400. Preferably the region 410 wherein the etching of the canal 412 is to occur is disposed near the geometric center of the receptacle well 406 and the integrated circuit die to be mounted in the receptacle well 406.

Etching of the oxide layer 402 in the region 410 in FIG. 4B is accomplished using the same room temperature isotropic buffered hydrofluoric acid solution described above—in a volumetric ratio of 1:6. The canal or port 412 is etched in the silicon wafer 400 through the oxide and photoresist materials using a room temperature solution of nitric acid ($HNO_3$) 15 parts, glacial acidic acid ($CH_3COOH$) 5 parts, and hydrofluoric acid (HF) 2 parts. The flared or bell-shape indicated for the canal 412 is acceptable for use as a liquid epoxy reservoir and desirably accommodates epoxy volume errors. Dispensing errors, dimensional tolerance accumulation and epoxy expansion and contraction contribute to these volume errors and affect the amount of epoxy material desired desirably to retaining the circuit die and epoxy assembly captive within the well and canal.

Figure 6A:
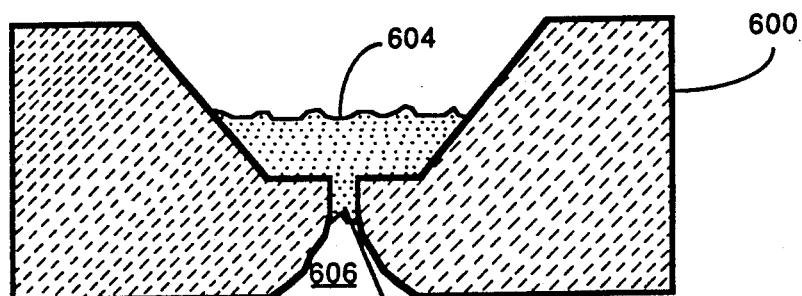
FIG. 6 shows a circuit die to wafer receptacle well attachment in accordance with the invention.
Figure 6B:
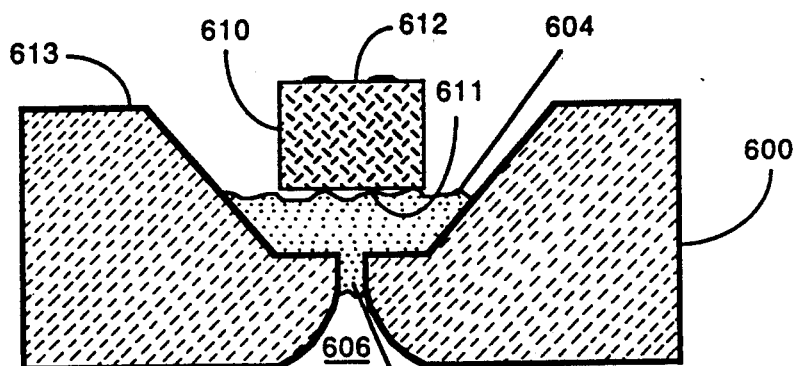
Figure 6C:
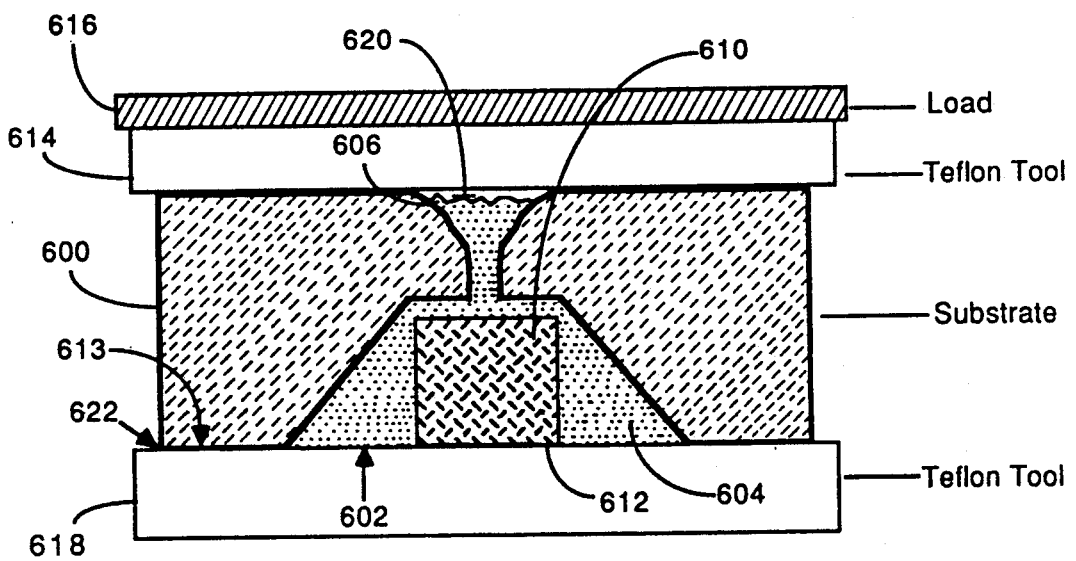

FIG. 6 in the drawings, including the views of FIGS. 6A, 6B, and 6C, shows events relating to the mounting of an integrated circuit die 610 in an etched receptacle well 602. In the present invention, the epoxy material as shown at 604 in FIG. 6 is preferably a high bond strength adhesive that is physically and chemically compatible with the other materials and the fabrication processes of the wafer scale integration assembly. A list of die bonding epoxy and other materials such as might be employed in the assembly of FIG. 5 appears in the June 1987 issue of the publication "Micro Electronic Manufacturing and Testing".

This list includes a number of adhesives including one designated as EP34CA that is manufactured by Master Bond Inc. of P.O. Box 522, Teaneck, NJ 07666. A catalog listing from this same Master Bond Inc. which recites salient properties of the EP34CA epoxy adhesive is identified in the appendix of the present application and included in the application file wrapper. For use in the present invention, a modified version of the EP3-4CA adhesive, that is a version modified to include lithium beta eucryptite slightly in excess of 50% by weight as a dielectric filler is preferred. The additional filler material in this adhesive achieves a thermal coefficient of expansion nearly matching that of silicon, that is, a coefficient of approximately $2.5 \times 10^{-6}/°$ C. The dielectric filler material is a lithium aluminum silicate composition (1397° C. decomposition temperature). The filled epoxy material is compatible with silicon integrated circuit processing and in its cured phase, is chemically and physically stable to 300° C.

The drawing views of FIGS. 6A, 6B, and 6C illustrate key steps in the present invention mounting of an integrated circuit die in receptacle wells of a host wafer. In the initial step of FIG. 6A, the epoxy material 604 is applied to the bottom region of each receptacle well using a device such as a micro syringe or automated dispensing equipment. Since the epoxy material is in an uncured viscous state with a viscosity in the range of 140 to 150 $P_a$-S, (Pascal—Seconds or Newton—seconds/meter$^2$) a portion of this material as shown at 608 will flow into the back surface accessing canal portion 606 of the host wafer 600.

Insertion of the integrated circuit die into the receptacle well is indicated in the FIG. 6B view of FIG. 6 and is accomplished, for example, with a micro vacuum chuck tipped with a polytetrafluoroethylene material. All of the die are inserted into the receptacle wells of a host wafer at the same time. As indicated in FIG. 6B, immediately following insertion, the active surface 612 of the inserted die 610 initially resides above the plane of the host wafer indicated at 613 with the die 610 being "floated" on the viscous epoxy 604. The bottom surface of the die 610, the surface 611, is preferably covered with the standard passivation layer of silicon dioxide that has been chemically vapor deposited to add noticeably to the process yield. The glass passivation layer manifests itself as a smooth topological surface.

Following insertion of the last integrated circuit die, a flat tooling member 618 is positioned to rest on the top surface 613 of the die 610 and the host wafer 600. This sandwiched tool, die and wafer assembly is then inverted and positioned under another flat tooling member 614 by the application of force as from a clamping arrangement or from a load member 616. The tooling member 618 and the similar tooling member 614 in FIG. 6C are preferably fabricated from materials that are immune to adhesive attachment by the epoxy material 604. The Teflon ® polytetrafluoroethylene material sold by E.I. Dupont DeNemours Company and other suppliers has been found to have such immunity to adhesive attachment and therefore is a suitable fabrication material for the tooling members 614 and 618. The load member 616 in FIG. 6C can have a weight in the range of 600 grams when assemblies of the FIG. 5 type having a relatively small number of integrated circuit die are being fabricated.

The inverted loading between tooling members of the wafer assembly, as shown in FIG. 6C, serves a plurality of functions in the present invention. Among these functions are the coplanarizing of the wafer and die surfaces 612 and 613; that is, the pressing of die 610 into the viscous epoxy material 604. An additional function of the FIG. 6C sandwich arrangement is for the tooling member 618 to provide a flat planar configuration for the epoxy material 604 in the wafer surface annular region intermediate the die 610 and host wafer 600. By way of the viscous nature of the uncured epoxy material 604 assuming the planar shape of the tooling member 618 during the inverted sandwich disposition in FIG. 6C, a desirable uniplanar continuous flat surface is provided for the mounted die 610 and host wafer 600 assembly.

The sandwich arrangement of FIG. 6C also places the canal aperture 606 portion of the wafer 600 in a desirable chimney relationship with the well and the epoxy 604—a relationship wherein excess epoxy material readily rises into the canal cross-section as shown in FIG. 6C. Such rising can occur during the planarizing act and also during the subsequent thermal curing cycle. The flat planar nature of the tool 618 and the host wafer 600 in FIG. 6C can also be observed to provide a retention or sealing effect for the viscous epoxy material prior to the thermal curing cycle, since the close fitting of the tooling member 618 and the wafer surface 613 in the region 622 serve to preclude escape of the viscous epoxy material prior to curing.

Preferably the quantity of epoxy material deposited in the step of FIG. 6A is controlled to a degree assuring the presence of some air gap or void region 620 between the epoxy surface and the surface of the tooling member 614 during and after the thermal curing cycle. This air gap or void region, of course, limits the build-up of pressures within the cavity 602 and assures the absence of epoxy material seeping between the host wafer surface and the tooling member 614. The Teflon ® material for the tooling member 614 and 618 is preferably arranged to have surface flatness that is uniform to within, for example, eight microns and a surface bow less than 50 microns in order to achieve desirable surface characteristics for the finished assembly.

The thermal curing cycle for the FIG. 6C sandwich preferably includes a profile of time and temperature that is compatible with the epoxy material selected. In the case of the preferred modified Master Bond EP3-4CA epoxy, the application of heat according to a linear ramp of increasing temperature from room temperature to 70° C. over a 1.5 hour period followed by an increase from 70° C. to 250° C. over a two hour period, a 250° C. cure for six hours, and a linear temperature ramp down from 250° C. to room temperature over a three hour period is found to be satisfactory. A temperature profile of this nature causes the epoxy material 604 to at first flow and create the desired planar transition between surfaces of the host wafer and each mounted integrated circuit die. After returning to room temperature, the load members 616 and the Teflon ® tooling members 614 and 618, are separated from the wafer assembly, such separation being aided by the lack of bonding of the epoxy material with the Teflon of the tooling members 614 and 618.

Following the FIG. 6 integration of the die and host wafer into a unitary assembly of the FIG. 5 type, application of materials forming an electrical insulating surface, a surface of the type indicated at 534 and 536 in FIG. 5, is possible. According to one aspect of the present invention, the material preferred for the electrical insulating surfaces 534 and 536 endows these surfaces with a multi-functional capability that is desirable. The light sensitive polyimide precursor coating, preferred for the surfaces 534 and 536, is in fact, found to include the following desirable characteristics:

1. Electrical insulation between conducting members separated by the coating material;
2. Surface passivation of the integrated circuit die, the die 508, 522 and 544 in FIG. 5, for example. Passivated die and wafer surfaces are, of course, additionally immune to moisture, dirt, oxidation, and foreign matter effects.
3. A via aperture defining media for electrical connecting metal paths;
4. A photoresponsive media for via fabrication;
5. Planarization of the die, the die mounting epoxy, and the wafer surfaces;
6. An alpha particle shield for the circuit die;
7. Good insulation properties with a low dielectric constant;
8. Service as a metal liftoff mask where needed;
9. Service as an ion etch mask;
10. Good adhesion characteristics with the die and wafer materials, metal conductors and dielectrics;
11. Responsive to common production apparatus and processes;
12. Disposable in a large range of coating thicknesses:
13. Possession of a thermal coefficient of expansion that is compatible with other materials used in the FIG. 5 assembly; i.e., for the polyimide: $20 \times 10^{-6}/°$ C.; for aluminum: $25 \times 10^{-6}/°$ C.; for silicon: $2.3 \times 10^{-6}/°$ C.; for the previously described filled epoxy: $2.5 \times 10^{-6}/°$ C. and for silicon dioxide: $0.5 \times 10^{-6}/°$ C.

The material preferred for use in the layers 534 and 536 of FIG. 5 is the Selectilux HTR 3-200 polyimide negative photo-resist that is sold by E.M. Industries, Inc. of Hawthorne, NY 10532 and San Jose, CA 95131. E.M. Industries, Inc. is an associate of E. Merck GMBH, a major European chemical supplier located in Darmstadt, West Germany. An adhesion promoter, Selectiplast HTR AP-1, and a developer, Selectiplast HTR D-2, as also supplied by EM Industries, Inc., are preferably used with the polyimide coating material. Additional information concerning the preferred Selectilux polyimide film material, including numerical values for important physical, chemical, and electrical properties, are to be found in the Merck Industries Chemical catalog which is identified in the appendix hereof and the copy of which is provided in the file history of the present application. More details concerning this material are to be found in the additional publications concerned therewith that are listed in the appendix to the present document and also included in the file history of the application. Optimum results are obtained with the HTR 3-200 material in the present invention using a 10 to 15 micron thickness of polyimide film as is achieved in a spinning application to the upper surface of the wafer and die assembly. A film of this nature is shown at 704 in FIG. 7 of the drawings.

The salient steps in the application of one polyimide film layer and associated die electrical connecting conductors to the assembly of the present invention are shown in the views of FIGS. 7A, 7B, 7C, 7D, and 7E of FIG. 7. Application of the film 704 preferably includes baking of the substrate at 150° C. for one hour to dehydrate the top surface portions, followed by application of the Selectiplast HTR AP-1 adhesion promoter. The adhesion promoter is preferably spun onto the cooled (room temperature or 22° C.) top surface of the substrate using a 30 second spin at 4000 rpm. The adhesion promoter is subjected to a three minute bake at 150° C. after which the Selectilux HTR 3-200 photo sensitive polyimide is spun onto the cooled surface (22° C.) using a 20 second spin at 2000 rpm to achieve a film thickness of about 10 microns.

Figure 7A:
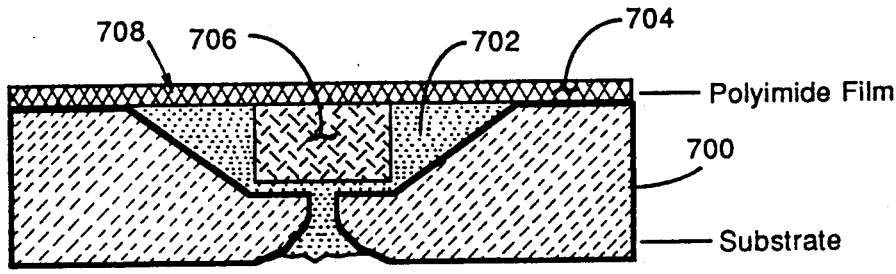
FIG. 7 shows a die interconnection sequence in accordance with the invention.
Figure 7B:
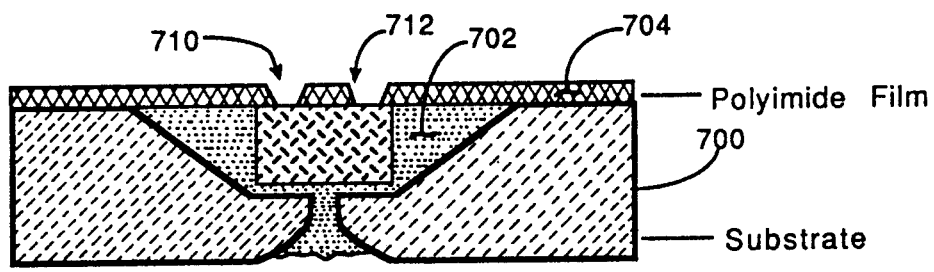

Fabrication of sloping wall vias 710 and 712 in the polyimide coating 704 is illustrated in FIG. 7B of the drawings. Fabrication of these vias commences with a soft baking at 65° C. for two hours and is followed by proximity printing of an appropriate photolithographic mask. To achieve a 125 micron square bonding pad via, a pad characteristic of conventional VLSI circuitry, a 400 millijoule per centimeter squared ultraviolet energy exposure using a separation of about ten mils is used. Removal of the exposed polyimide material is then accomplished in a conventional manner using the Selectiplast HTR D-2 developer solution.

Figure 7C:
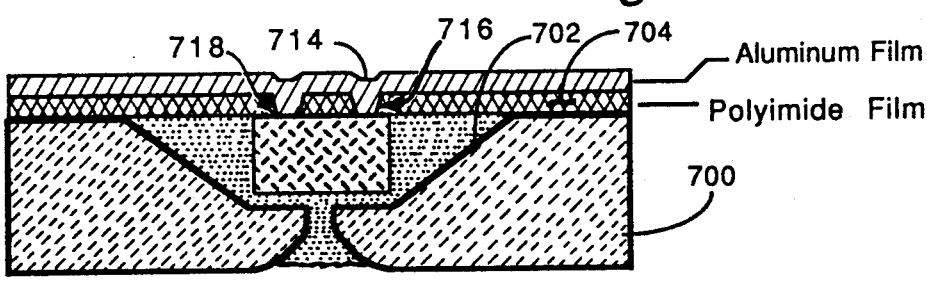

Deposition of the conductor metallic aluminum film, 714 in the FIG. 7 assembly, is illustrated in FIG. 7C of FIG. 7 with the via dwelling portions of this film being indicated at 716 and 718 at FIG. 7C. The aluminum film indicated at 714 in FIG. 7C is preferably deposited in a thickness of 0.8 to 1.0 micron in order to ensure sufficient coverage of the sloped wall vias. Film deposition is preferably accomplished by sputtering onto the top surface of the patterned polyimide film 704.

The sputter deposited film can be patterned into a matrix of aluminum conductors by use of a photolithographic mask prepared either manually using an optical microscope with a micron feature measurement scale and an adjustable translation stage or with commercially available mask making equipment. Prior to contact printing with this photolithographic mask, the top surface of the sputtered aluminum film is covered with a spun-on 20 micron thick positive photoresist film of, for example, Shipley M1350J photoresist. A thicker photoresist layer of this nature is desirable to achieve the needed degree of planarization of the aluminum film with respect to the topography features of the smooth wall via polyimide layer.

Figure 7D:
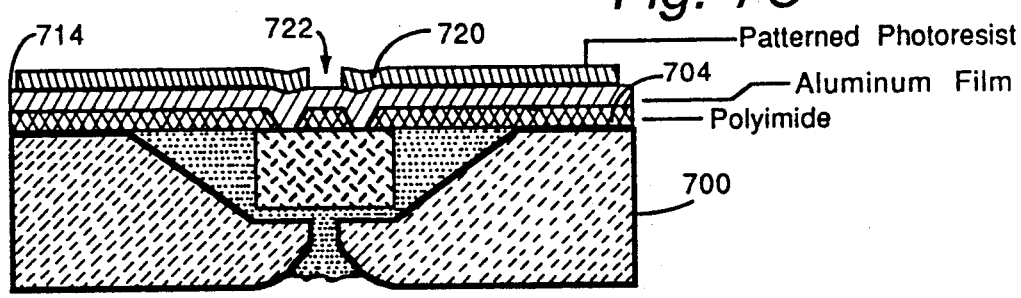

Following a 95° C. 25 minute standard photoresist soft bake, the photolithographic mask image is aligned with respect to the underlying vias and contact printed using an ultraviolet energy exposure of 180 millijoules per centimeter squared. Following a standard positive photoresist development process, the remaining pattern is hard-baked at 120° C. for 30 minutes to provide the aluminum masking arrangement illustrated at 720 and 722 in FIG. 7D. The mask aperture 722 in FIG. 7D, of course, designates the portion of the aluminum film 714 to be removed, and thereby form two separate conductors in the FIG. 7D illustrated film. Etching of the aluminum conductor designated by the mask aperture 722 may be accomplished using a 1:4:4:1 mixture by volume of nitric acid ($HNO_3$) glacial acidic acid ($CH_3COOH$), phosphoric acid ($H_3PO_4$), and deionized water at a controlled temperature of 50° C. The aluminum etch rate is approximately 2000 angstroms per minute. Stripping of the remaining photoresist mask may be accomplished with acetone ($CH_3COCH_3$) to provide the conductor arrangement indicated in FIG. 7E of the drawings. The gap 724 in FIG. 7E is, of course, typical of the separations achieved in fine resolution aluminum film layer etching to form an array of interconnecting conductors as shown in FIG. 5.

Figure 7E:
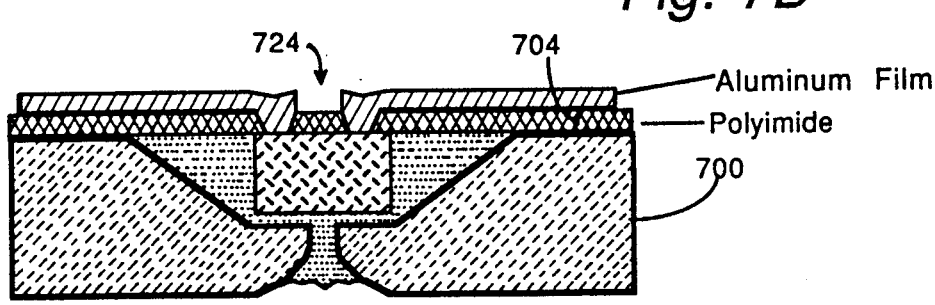

The FIG. 7E described process completes the fabrication of a single conductor layer hybrid-wafer scale integration electronic assembly. The materials employed in the described processing, however, lend well to the fabrication of two, three, or more layers in a wafer scale integration circuit assembly. In such a multiple-layered assembly, the successive layers include a plurality of aluminum interconnect conductor arrays that pass through appropriate via apertures to a lower level conductor or die bonding pad.

The wafer scale integration arrangement of the present invention therefore enables the realization of complex integrated circuit die interconnect schemes which emulate the technology of multiple layer printed circuit boards in flexibility but with the incorporated advantages of reduced mass, geometric dimensions, thermal dissipation, physical reliability and other advantages.

While the apparatus and method herein described constitute a preferred embodiment of the invention, it is to be understood that the invention is not limited to this precise form of apparatus or method, and that changes may be made therein without departing from the scope of the invention, which is defined in the appended claims.

APPENDIX—BIBLIOGRAPHY

1. "Merck Electronic Chemicals, Photoresists", EM Industries Inc., Hawthorne, NY, San Jose, CA and MERCK, Darmstadt, Germany;
2. "A Screen-Printable Polyimide Coating for Silicon Wafers", Kulesca et al, Motorola, Inc., Phoenix, AZ;
3. "High Resolution, High Photospeed Polyimide for Thick Film Applications", Rohde et al, Ciba-Geigy Corporation, Santa Clara, CA;
4. "Polyimides in Hybrid Circuit Processing", John J.H. Reche, Reche Corp., Mountain View, CA;
5. "Pattering with Photosensitive Polyimide Precursors", Semiconductor International, October 1987;
6. "Microelectronic Manufacturing and Testing", April 1987;
7. "EPO-TEK 600, Screen Printable Water Coating", Epoxy Technology, Inc., Billerica, MA; EM Industries, Inc., Advanced Chemicals Division, San Jose, CA;
8. "Die Bonding Equipment", Microelectronic Manufacturing and Testing, June 1987.
9. Master Bond Epoxy Adhesives, Sealants & Coatings—Application Selector Guide—One component Series, Master Bond Inc., P.O. Box 522, Teaneck, NJ 07666, 1986.

I claim:

1. A wafer scale integration multiple die integrated circuit structure comprising the combination of:
   a semiconductor wafer host member having top and bottom planar surfaces;
   a plurality of receptacle wells each having lateral and bottom surfaces received in selected top surface locations of said wafer;
   a plurality of integrated circuit die, each die including a planar top surface having a plurality of electrical connection bonding pads adjacent thereto, a bottom surface, and lateral surfaces joining said top and bottom surfaces, said die being uprightly received one in each of said wafer member receptacle wells with said die top surface and said wafer surface being disposed in substantial planar alignment by the die bottom surface to receptacle well bottom surface thickness of interstitial cured epoxy adhesive means;
   cured epoxy adhesive means, including a predetermined thermal coefficient of expansion selective particulate filler material uniformly dispersed therein, received in each of said receptacle wells intermediate each respective of said well and die bottom surfaces and said well and die lateral surfaces for physically connecting said die and wafer elements, said adhesive means also including an annularly disposed and planar surface aligned top surface portion bridging between the planar surfaces of said die and wafer.

2. The integrated circuit structure of claim 1 further including an organic dielectric material film layer received over said top surfaces of said wafer and die and adhesive means planar surface aligned top surface portion.

3. The integrated circuit structure of claim 1 wherein said adhesive means includes lithium beta eucryptite filler material.

4. The integrated circuit surface structure of claim 2 wherein respective of said circuit die are received in said receptacle wells in a varying spaced apart relationship with said receptacle well bottom surfaces and wherein the spaced apart interval between a die bottom surface and the adjacent receptacle well bottom surface is occupied by complementary dimensioned portions of said cured epoxy adhesive means.

5. The integrated circuit structure of claim 2 further including:
   a plurality of via apertures passing through said thin film dielectric material layer at locations coincident with said electrical connection bonding pads;
   an array of thin film metal conductors including both conductor portions extending through said via apertures to said die electrical bonding pads and individual conductor portions residing on said thin film dielectric layer in a predetermined pattern of electrical interconnection.

6. The integrated circuit structure of claim 5 wherein said cured epoxy adhesive means includes a thermal coefficient of expansion having the same algebraic sign as the thermal coefficients of expansion of silicon and aluminum.

7. The integrated circuit structure of claim 6 wherein said polymerized filled epoxy adhesive has a thermal coefficient of expansion that is numerically intermediate the thermal coefficients of expansion of silicon and aluminum.

8. The integrated circuit structure of claim 7 wherein said epoxy adhesive coefficient of expansion resides in the range of $2.3\times10^{-6}$ to $20\times10^{-6}$ per degree Celsius.

9. The integrated circuit structure of claim 8 wherein said thermal coefficient of expansion is substantially $2.5\times10^{-6}$ per degree Celsius.

10. The integrated circuit structure of claim 5 wherein said organic dielectric material layer is comprised of a photosensitive material.

11. The integrated circuit structure of claim 5 wherein said receptacle wells include sloping side surfaces with the slope of said side surfaces corresponding to the Miller index crystal orientation of said wafer member.

12. The integrated circuit structure of claim 5 wherein said thin film metal conductors are fabricated from aluminum.

13. The integrated circuit structure of claim 10 wherein said organic dielectric meaterial is a polyimide material.

14. The integrated circuit structure of claim 13 wherein said organic dielectric material is a negative photoresist polyimide material.

15. The integrated circuit structure of claim 13 further including an adhesion promotion layer disposed intermediate said wafer member and said polyimide material.

16. The integrated circuit structure of claim 13 further including additional alternating layers of said polyimide dielectric and thin film metal conductor materials.

17. The integrated circuit structure of claim 3 wherein said adhesive means includes a polymerized high bond strength dielectric filled epoxy adhesive having a two hundred fifty degree curing temperature characteristic.

18. The integrated circuit structure of claim 17 wherein said semiconductor host wafer is comprises of silicon and integrated circuit die is comprised of one of the materials of silicon and gallium arsenide and includes a thermal oxide passivation layer.

19. An integrated circuit assembly comprising the combination of:
a planar disposed semiconductor substrate member;
means including a predetermined number of sloping sided receptacle wells, one for each assembly received circuit die, disposed over a planar surface of and extending into said substrate member for receiving said circuit die in said substrate member;
integrated circuit die members of said predetermined number count and each having a top planar, bottom, and lateral surfaces received one in each said receptacle well;
means including a mass of dielectric filled cured adhesive received in each said receptacle well in contact with both said receptacle well sloping sides and said die lateral and bottom surfaces, and disposed in coplanar connection between said die top surface and substrate member planar surface for retaining each said circuit die captive in a predetermined physical relationship with said receiving receptacle well and said substrate member and for contributing to the heat transfer between said die and said substrate member;
means including an electrically insulating light sensitive polyimide precursored thin film organic coating intimately disposed over said die top surface, said die top surface to substrate member connecting adhesive coplanar surface, and said substrate planar surface of said assembly for isolating said die and substrate members from external influence; and,
electrical interconnection means including an array of electrical interconnection conductors disposed over said thin film organic coating and including conductor portions extending through vias in said thin film organic coating to each of said circuit die members for conducting signals and operating energy in communication with each said die member.

20. The integrated circuit assembly of claim 19 wherein said cured adhesive material is comprised of a selected thermal coefficient of expansion dielectric material particle-filled epoxy resin.

21. The integrated circuit assembly of claim 20 wherein said dielectric material particles are comprised of lithium beta eucryptite.

22. A wafer scale integration multiple die integrated circuit structure comprising the combination of:
a semiconductor wafer host member having top and bottom planar surfaces;
a plurality of receptacle wells each having lateral and bottom surfaces received in selected top surface locations of said wafer;
a plurality of integrated circuit die, each die including a planar top surface having a plurality of electrical connection bonding pads adjacent thereto, a bottom surface, and lateral surfaces joining said top and bottom surfaces, said die being uprightly received one in each of said wafer member receptacle wells with said die top surface and said wafer top surface being disposed in substantial planar alignment by the die bottom surface to receptacle well bottom surface thickness of interstitial cured epoxy adhesive means; and
cured epoxy adhesive means, including a predetermined thermal coefficient of expansion selective particulate filler material uniformly dispersed therein, received in each of said receptacle wells intermediate each respective of said well and die bottom surface and said well and die lateral surfaces for physically connecting said die and wafer elements, said adhesive means also including an annularly disposed and planar surface aligned top surface portion bridging between the planar surfaces of said die and wafer;
said receptacle wells each including canal means connecting said receptacle well bottom surface with the bottom surface of said wafer member for venting volatile products attending the curing of said epoxy adhesive means out of said receptacle wells, reservoiring excessive quantities of said epoxy adhesive means before and during said curing, and for assisting retention of said epoxy adhesive means and circuit die captive within said receptacle wells.

23. A multiple die wafer scale integration electrical circuit structure comprising the combination of:
a silicon dioxide covered silicon semiconductor wafer host member having substantially planar top and bottom surfaces;
a plurality of sloping side surface anisotropic etched receptacle wells received in selected top surface locations of said oxide covered wafer, said wells each including a canal portion communicating between the receptacle well bottom and the wafer bottom surface;

a plurality of prefabricated integrated circuit die members each having top, bottom and side body surface regions, and selectively including die of differing top to bottom thicknesses, received one in each of said wafer member receptacle wells with said die members and receptacle wells having space separated rectangular shapes in the wafer surface plane and with each of said die including a plurality of upward facing electrical bonding pads;

a mass of polymerized dielectric filled epoxy adhesive, of thermal expansion properties substantially similar to said silicon semiconductor wafer, disposed surrounding the side and bottom body regions of each said die member in the space intermediate said die member body and said wafer member receptacle well side surfaces, said adhesive mass including solidified liquid bonds with said circuit die body surface regions and with said receptacle well surfaces, and including a planar surface portion filling said surface plane separation space and smoothly bridging between said die member surface and said wafer member surface to integrate said die members and wafer member into a unified wafer assembly;

a conformal dielectric negative photoresist polyimide thin film coating of between five and thirty microns thickness received together with an adhesion promotion intermediate film layer over the surface of said wafer and integrated circuit die assembly;

a plurality of etched sloping wall via apertures opening through said polyimide thin film coating to said integrated circuit die electrical bonding pads; and an array of metallic aluminum thin film conductors extending through said via apertures in connection with said electrical bonding pads and dispersed across the bridged separation space between said die member and wafer member and across the surface of said wafer member in predetermined electrical circuit interconnection;

said conformal dielectric negative photoresist polyimide thin film coating and array of metallic aluminum conductors being disposed in a 2×N stacked and alternating layers over the surface of said wafer assembly where N is a number between one and ten.

24. An integrated circuit assembly comprising the combination of:
a planar disposed semiconductor substrate member;
means including a predetermined number of sloping sided receptacle wells, one for each assembly received circuit die, disposed over a planar surface of and extending into said substrate member for receiving said circuit die in said substrate member;
integrated circuit die members of said predetermined number count and each having a top planar, bottom, and lateral surfaces received one in each said receptacle well;
means including a mass of lithium beta eucryptite dielectric filled cured adhesive received in each said receptacle well in contact with both said receptacle well sloping sides and said die lateral and bottom surfaces, and disposed in coplanar connection between said die top surface and said substrate member planar surface for retaining each said circuit die captive in a predetermined physical relationship with said receiving receptacle well and said substrate member and for contributing to heat transfer between said die and said substrate member;
means including an electrically insulating light sensitive polyimide precursored thin film organic coating intimately disposed over said die top surface, said die top surface to substrate member connecting adhesive coplanar surface and said substrate planar surface portions of said assembly for isolating said die and substrate members from external influence; and,
electrical interconnection means including an array of electrical interconnection conductors disposed over said thin film organic coating and including conductor portions extending through vias in said thin film organic coating to each of said circuit die members for conducting signals and operating energy in communication with each said die member.

25. The integrated circuit assembly of claim 24 wherein said lithium beta eucryptite comprises fifty percent by weight of said cured adhesive.

26. A wafer scale integration multiple die integrated circuit structure comprising the combination of:
a semiconductor wafer host member having top and bottom planar surfaces;
a plurality of receptacle wells each having lateral and bottom surfaces received in selected top surface location of said wafer;
a plurality of integrated circuit die, each die including a planar top surface having a plurality of electrical connection bonding pads adjacent thereto, a bottom surface, and lateral surfaces joining said top and bottom surfaces, said die being uprightly received one in each of said wafer member receptacle wells with said die top surface and said wafer top surface being disposed in substantial planar alignment by the die bottom surface to receptacle well bottom surface thickness of said cured epoxy adhesive means; and
cured epoxy adhesive means, including a predetermined thermal coefficient of expansion selective lithium beta eucryptite particulate filler material uniformly dispersed therein, received in each of said receptacle wells intermediate each respective of said well and die bottom surface and said well and die lateral surfaces for physically connecting said die and wafer elements, said adhesive means also including an annularly disposed and planar surface aligned top surface portion bridging between the planar surfaces of said die and wafer.

* * * * *

UNITED STATES PATENT AND TRADEMARK OFFICE
CERTIFICATE OF CORRECTION

PATENT NO. : 4,989,063

DATED : January 29, 1991

INVENTOR(S) : Edward S. Kolesar, Jr.

It is certified that error appears in the above-identified patent and that said Letters Patent is hereby corrected as shown below:

```
Col 5, line 19, "proVide" should read ---provide---.
Col 6, line 3, the comma should be deleted.

Col 7, line 15, ---. The 300 micron--- should appear
following "capability".
Col 8, line 24, "concept of" should read ---planar---.
Col 8, line 25, "Parenthe" should not be capitalized.
Col 8, line 53, "Planar" should not be capitalized.
Col 9, line 16, a comma should follow "is".
Col 9, line 18, "Planar" should not be capitalized.
Col 13, line 46, the colon should be a semicolon.
Col 17, line 19, "meaterial" should read ---material---.
Col 17, line 37, "comprises" should read ---comprised---.
```

Signed and Sealed this

Twenty-sixth Day of January, 1993

Attest:

STEPHEN G. KUNIN

*Attesting Officer*  *Acting Commissioner of Patents and Trademarks*